United States Patent
Halter

(10) Patent No.: US 7,615,939 B2
(45) Date of Patent: Nov. 10, 2009

(54) SPECTRALLY CALIBRATABLE MULTI-ELEMENT RGB LED LIGHT SOURCE

(75) Inventor: Michael A. Halter, Conway, AR (US)

(73) Assignee: C&D Zodiac, Inc., Huntington Beach, CA (US)

( * ) Notice: Subject to any disclaimer, the term of this patent is extended or adjusted under 35 U.S.C. 154(b) by 1249 days.

(21) Appl. No.: 10/802,277

(22) Filed: Mar. 17, 2004

(65) Prior Publication Data

US 2004/0245946 A1 Dec. 9, 2004

Related U.S. Application Data

(60) Provisional application No. 60/455,269, filed on Mar. 17, 2003, provisional application No. 60/455,129, filed on Mar. 17, 2003, provisional application No. 60/455,126, filed on Mar. 17, 2003, provisional application No. 60/455,127, filed on Mar. 17, 2003.

(51) Int. Cl.
*G05F 1/00* (2006.01)

(52) U.S. Cl. ............. 315/307; 315/291; 315/224; 315/312; 362/231; 358/504; 358/509

(58) Field of Classification Search ............. 315/312, 315/149, 151, 224, 291, 307; 362/227, 231, 362/236, 543, 545, 800; 358/509, 513, 514, 358/520, 504

See application file for complete search history.

(56) References Cited

U.S. PATENT DOCUMENTS

| | | | |
|---|---|---|---|
| 5,317,292 A | 5/1994 | Leeb | |
| 5,373,109 A | 12/1994 | Argyrakis et al. | |
| 5,420,482 A | 5/1995 | Phares | |
| 5,631,446 A | 5/1997 | Quan | |
| 5,632,833 A | 5/1997 | Kurano et al. | |
| 6,016,038 A | 1/2000 | Mueller et al. | |
| 6,020,559 A | 2/2000 | Maeda | |
| 6,055,722 A | 5/2000 | Tighe et al. | |
| 6,150,774 A | 11/2000 | Mueller et al. | |
| 6,166,496 A | 12/2000 | Lys et al. | |
| 6,211,626 B1 | 4/2001 | Lys et al. | |
| 6,292,901 B1 | 9/2001 | Lys et al. | |
| 6,340,868 B1 | 1/2002 | Lys et al. | |
| 6,368,378 B2 | 4/2002 | Sasaki | |
| 6,501,166 B2 | 12/2002 | Wood et al. | |

(Continued)

FOREIGN PATENT DOCUMENTS

JP    A 7-320535    12/1995

(Continued)

OTHER PUBLICATIONS

MAX5258/MAX5259 Data Sheet, Maxim Integrated Products, Sunnyvale, CA (2001).

(Continued)

*Primary Examiner*—Haissa Philogene
(74) *Attorney, Agent, or Firm*—Kilpatrick Stockton LLP

(57) ABSTRACT

An LED lighting system is disclosed. The lighting system includes means to calibrate the light temperature and intensity between multiple modules in one system, or to calibrate the light temperature and intensity against a known reference standard. The lighting system may be used in many illumination applications, including the cabin sections of aircraft and watercraft.

23 Claims, 3 Drawing Sheets

U.S. PATENT DOCUMENTS

| | | |
|---|---|---|
| 6,528,954 B1 | 3/2003 | Lys et al. |
| 6,548,967 B1 | 4/2003 | Dowling et al. |
| 6,565,774 B2 | 5/2003 | Ohashi et al. |
| 6,577,080 B2 | 6/2003 | Lys et al. |
| 6,608,453 B2 | 8/2003 | Morgan et al. |
| 6,624,597 B2 | 9/2003 | Dowling et al. |
| 6,759,814 B2 * | 7/2004 | Vogel et al. .................. 315/312 |
| 7,344,279 B2 * | 3/2008 | Mueller et al. .............. 362/294 |

FOREIGN PATENT DOCUMENTS

| | | |
|---|---|---|
| JP | A 9-129028 | 5/1997 |
| JP | A 11-71601 | 3/1999 |
| JP | A 11-242913 | 9/1999 |
| JP | A 2000-106035 | 4/2000 |

OTHER PUBLICATIONS

Application Note, "SPI Interface Used in a Daisy-Chain," Infineon Technologies AG, Munich, Germany.

LM2674, Simple Switcher Power Converter High Efficiency 500 mA Step-Down Voltage Regulator Data Sheet, Naitonal Semiconductor Corporation, Santa Clara, CA (2001).

\* cited by examiner

SPECTRALLY CALIBRATABLE MULTI-ELEMENT RGB LED LIGHT SOURCE

CROSS-REFERENCE TO RELATED APPLICATIONS

The present application claims the benefit of U.S. provisional patent application Ser. No. 60/455,269, entitled "Spectrally Calibratable Multi-Element RGB LED Light Source"; 60/455,129, entitled "Indirect Lighting System Architecture and Implementation"; 60/455,126, entitled "Anisotropic Etching of Silicon Wafer Materials to Create Micro-Reflector Cavities for LED Die"; and 60/455,127, entitled "Micro-Strip-Line Signal and Power Buss Flexible Cable and Method of Using Same," each of which was filed on Mar. 17, 2003, and for each of which the inventor is Michael A. Halter. The present application is further related to the three co-pending applications filed on even date herewith entitled "Indirect Lighting System Architecture and Implementation," "Anisotropic Etching of Silicon Wafer Materials to Create Micro-Reflector Cavities for LED Die", and "Micro-Strip-Line Signal and Power Bus Flexible Cable and Method of Using Same," the inventor for each of which is Michael A. Halter. The entire disclosure of each of the foregoing provisional and non-provisional applications are incorporated herein by reference.

BACKGROUND OF THE INVENTION

The present invention relates to illumination systems, and in particular to control systems for red-green-blue (RGB) light emitting diode (LED) illumination systems that allow the light temperature and intensity generating by the illumination systems to be dynamically calibrated.

LEDs are semiconductors that convert an electrical energy into light. Since LEDs generate relatively little heat compared to other common forms of lighting, such as incandescent lights, the energy conversion process performed by LEDs is quite efficient. This is a highly desirable trait in lighting systems to be used for illumination, since excessive heat production not only wastes electricity, but may also require extensive heat dissipation efforts and may even raise safety concerns depending upon the fixture installation. Some of the other advantages that make LEDs desirable for illumination applications include their small size; their relatively high radiance (that is, they emit a large quantity of light per unit area); their very long life, leading to increased reliability; and their capacity to be switched (that is, turned on and off) at very high speeds.

While visible light LEDs have been applied in a number of fields since their invention in 1960, they have been used for illumination applications only relatively recently. One of the primary limitations in the use of LEDs in this field has been the difficulty of producing white light. White light consists of a mixture of light wavelengths across the visible light spectrum. Traditional LEDs cannot produce white light; instead, each LED can produce only light in one very narrow frequency band. It is well known that the combination of light in the three primary colors of red, green, and blue will produce white light. In fact, any color of light may be produced by the appropriate combination of light in these three colors. While red and green LEDs have been commercially available for decades, the blue LED was not developed until 1993, when it was introduced by the Nichia Corporation of Japan. By combining these traditional red, green, and blue LEDs in a tightly coupled pattern, a crude form of white light could then be produced. By varying the relative intensity of the light emitted by the red, green, and blue LEDs, one could alter the color of light produced, thereby providing a light source that will generate light of any color desired.

An alternative method of producing white light, developed by the Nichia Corporation in 1996, is the coating of a blue LED with a white phosphor. The blue LED stimulates the phosphor to generate a broad band of visible light emissions, thereby producing white light. This method suffers from the limitation that the frequency band of light produced is fixed, and cannot be altered to produce different lighting effects from the same LED. This method is therefore inappropriate for applications where different colors of light or lighting effects may be desired.

In addition to the problem with producing white light, the other primary limitation on the use of LEDs for illumination applications has been their brightness, which historically was far below that of typical incandescent and fluorescent light sources. By 1997, however, the Nichia Corporation, along with Texas Instruments Incorporated of Dallas, Tex., were producing LEDs of sufficient brightness for many illumination applications. It thus became possible to provide complete illumination solutions using only LEDs in certain applications, such as relatively small, indoor areas.

As already explained, a very simple system for producing white light with LEDs could involve the application of a pre-set current to a combination of red, green, and blue LEDs. It would be possible with such a system to emulate, for example, the color of light produced by daylight or by a typical incandescent bulb. Such a simple system would not, however, allow the user to take advantage of the many opportunities for temperature variance made possible by the use of an LED illumination system. (It should be noted that light color is often referred to as its "color temperature" or simply "temperature," corresponding to the temperature of a black body that would produce light of that color measured in degrees Kelvin.) Since both temperature and intensity of the light produced by an LED illumination system may be varied simply by varying the amount of electrical current applied to the red, green, and blue LEDs in the system, many desirable illumination effects become possible that would not be available with incandescent lights. For example, an illumination system might include settings to emulate ambient lighting conditions at different times of day. Or the system might allow for variance in the light temperature depending upon application, such as applying a "cold" blue-tinged light for reading purposes, while allowing a "warm" red-tinged light setting to be chosen at meal times. Far more subtle and complex effects are possible. In order to take advantage of such flexibility offered by an LED illumination system, however, some form of electronic control system is required.

The use of electronic control systems for the purpose of mixing light from red, green, and blue LEDs to produce lighting effects is known. For example, U.S. Pat. No. 5,420,482, issued to Phares, teaches a controlled lighting system that includes a set of light elements each having a control unit. The control units are individually addressable along a data bus. Information packets may be sent to each control unit by addressing each packet to match the address of the control unit. The data packets may contain information necessary to manipulate the output level of each of the light elements controlled by a particular control unit. In this way, the temperature and intensity of the light produced by each of the light elements may be manipulated by the use of digital information packets sent along a control bus. The system can thus produce an overall light output of varying temperature and intensity in response to digital signal inputs.

U.S. Pat. No. 6,016,038, issued to Mueller et al. and assigned to Color Kinetics, Inc. of Boston, Mass., teaches a method of controlling the intensity and temperature of an RGB LED system using pulse-width modulated (PWM) signals generated by a microcontroller. PWM is a well-known technique for controlling analog circuits with the output of a microprocessor or other digital signal source. A PWM signal is a square wave modulated to encode a specific analog signal level. In other words, the PWM signal is fixed frequency with varying width. The PWM signal is still a digital signal because, at any given instant of time, the full direct current (DC) supply current is either in the "on" or "off" state. The voltage or current source is thus supplied to the analog load by means of a repeating series of on and off pulses. The on-time is the time during which the DC supply is applied to the load, and the off-time is the period during which that supply is switched off. Given a sufficient bandwidth, PWM can be used to encode any analog value.

When the power to an LED is rapidly switched on and off, variance of the length of time during the on and off modes gives the effect of variance of the intensity of the light that is produced. As a result, a PWM signal can be used in place of a varying DC current to achieve intensity variance in an LED. PWM has numerous advantages over traditional analog control systems, including less heat production than analog circuits of similar precision, and significantly reduced noise sensitivity. Given the significant advantages that PWM control offers in communications and control systems applications, many microprocessors and microcontrollers produced today include built-in PWM signal generation units that may be directly applied to illumination control systems.

A significant limitation of the control system taught by the '038 patent, and of other prior art illumination control systems, is the inability to easily balance the spectral contributions of each LED source to permit each light module to be calibrated to match the color of a reference standard in a repeatable, standardized manner. The luminous and spectral content of commercially available LEDs varies significantly from unit to unit, in some cases by twenty percent or more. Because of this variability, some color balancing must take place in order to produce LED light fixtures of precisely consistent color temperature and intensity. While this level of precise light control is not necessary for many applications, such as the production of many lighting effects, this capability is critical in certain illumination applications, such as the illumination of small, interior spaces. In these applications, consistency in color and color temperature from lighting module to lighting module is very important. Where multiple LED lights or modules of LED lights are to be adjoined end to end or otherwise in close proximity to each other and are used to provide light over an area, the system must be balanced such that each LED light or module is producing light with the same temperature and intensity as other LED lights in the grouping. Otherwise, a visually noticeable variation in color and intensity of light output will be produced over the surface of the area to be illuminated. By allowing the light output of LED modules to be calibrated to match that of a reference standard, a control system could be configured to precisely produce light of a known temperature and intensity over the desired area.

The control system taught by the '038 patent does not allow for configuration or balancing of the light temperature and intensity between LEDs in a grouping or between LED groupings. In that controller, a simple current sink is used to drive the LED modules. The current sink is implemented using Darlington transistor pairs from a high current/voltage Darlington driver. The function of the current sink is to switch current between the LED module sets and system ground. The base of each Darlington pair is coupled to signal inputs. When a high-frequency square wave (PWM signal) is incident on a signal input, the Darlington transistor pair current sink switches current through a corresponding LED node with the identical frequency and duty cycle of the original PWM signal. This allows each color of LED to be varied in intensity independent of the other LED colors in a node. But the state of each signal output directly correlates with the opening and closing of the power circuit through the respective LED modules. The result is that the power to each LED set is controlled by the signal inputs, and the power circuit switching is performed at a frequency and duty cycle identical to that of the signal input.

The maximum current value that may be applied to each LED module as taught in the '038 patent is set by the use of static resistors added to each control circuit. The impedance value of these resistors can be altered only by replacing a resistor with one of a different impedance value. Because the current value applied to each of the LEDs is static when the LED is "on," the controller lacks the functionality to electronically calibrate the temperature and intensity of LEDs with respect to each other or with respect to a known standard value.

Because the control system taught by the '038 patent does not effectively allow calibration across the lighting system, it is ineffective as a control system for an LED lighting illumination system that comprises a plurality of RGB groupings. What is desired then is a controller for an RGB LED-lighting system that allows for the calibration of the temperature and intensity of the light produced by LED arrays within the lighting system. Such a controller would ideally be capable of calibrating LED arrays with respect to other LED arrays in a single light source, such as when used to produce light of varying color in an RGB method, and capable of calibrating LED arrays with respect to a known reference standard source for purposes of matching of LED arrays within a grouping of such arrays. The present invention achieves these objectives as described below.

BRIEF SUMMARY OF THE INVENTION

The present invention is directed to a lighting system that includes the capability to electronically calibrate the temperature and intensity of LED arrays within a single light source, and each of the LED arrays with respect to other LED arrays in a multi-array module or grouping. This capability is achieved by the implementation of a control system that eliminates the dependency of LED array current on supply voltage, and includes a programmable current source to permit the current through the LEDs to be electronically programmed to a known intensity. In a particular embodiment, a "series-pass" regulator may be used to achieve the current regulation function. In a series-pass regulator, a dynamic load is placed in series with the load to be regulated, in this case being an LED array. In one specific embodiment of the present invention, a high-gain amplifier is used in a feedback circuit with a sense resistor to implement the current regulator. The sense resistor is used to determine the current through the load at any given moment by measuring the voltage drop across the resistor. This voltage drop is compared to a reference voltage by the amplifier, which then feeds current to the dynamic load. The reference voltage is provided to the amplifier by a digital-to-analog converter. The use of a digital-to-analog converter permits the reference voltage and therefore the current through the dynamic load to be controlled by way of serial communications to the digital-to-analog converter.

At a minimum reference voltage the voltage drop across the dynamic load goes to a minimum value or "drop out" voltage, while at higher reference input voltages the voltage drop across the dynamic load increases so as to maintain a fixed current through the LED array. The total LED array current can therefore be digitally programmed by adjusting the output voltage of the digital-to-analog converter via the serial communications port of the digital-to-analog converter.

The lighting system with the controller described herein possesses a number of important advantages over prior art LED lighting system controllers. First, the current regulator allows the individual LEDs to operate at maximum drive current at all times, thereby increasing the maximum flux of the LEDs to meet lighting flux requirements. Second, the current regulator prevents the forward current through the LEDs from exceeding the LED maximum internal junction temperatures and maximum DC forward currents under worst-case conditions of ambient temperature and input voltage. This allows the lighting system of the present invention to operate in hostile environments where ambient temperature and input power quality may vary. Third, this control system allows the dimming of each LED array individually from 0% to 100% intensity. This feature permits the creation of various hues of light by varying the ratios of light from each color of LED as well as permits the dimming of the resultant colors. And finally, as already explained, this control system allows temperature and intensity matching between LEDs within a fixture or module and between fixtures or modules. This feature is essential in ensuring that all lighting modules produce the same color and intensity of light at a given duty cycle. This feature also permits a reference or "golden" light source to be established and all modules calibrated to this standard prior to shipment in a fixture for installation.

These and other features, objects and advantages of the present invention will become better understood from a consideration of the following detailed description of the preferred embodiments and appended claims in conjunction with the drawings as described following.

DETAILED DESCRIPTION OF THE PREFERRED EMBODIMENTS

With reference to FIGS. 1-4, a preferred embodiment of the present invention may be described. The preferred embodiment described herein is part of a lighting system for use as "wash" lights in the cabin sections of an aircraft or watercraft. Wash lights are intended to provide evenly dispersed background light to cover a defined indoor area. It should be understood, however, that the present invention is not limited to this particular application or these particular application environments. Other applications for the present invention in aircraft and watercraft include without limitation dome lights, reading lights, accent lights, galley lights, vanity lights, closet lights, baggage lights, and stair lights. Other application environments may include without limitation building indoor lighting, portable light sources, visual effects lighting, product display lighting, and marquis lighting.

Figure 1:
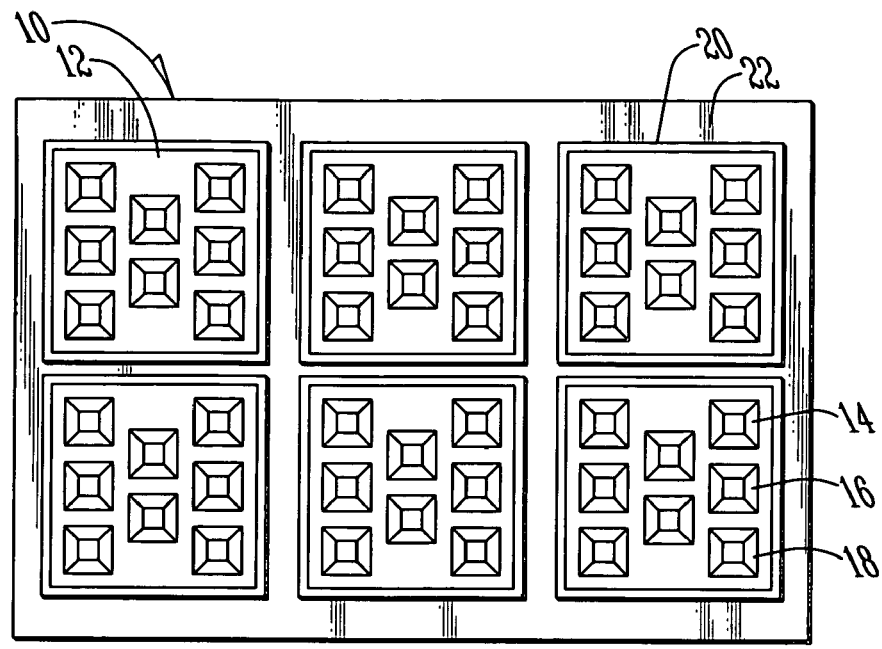
FIG. 1 is a diagram showing the configuration of an LED light module according to a preferred embodiment of the present invention.

As shown in FIG. 1, the invention comprises one or more wash light modules 10. Each of the wash light modules 10 are comprised of six silicon wafers 12 containing eight chip-on-wire LED units. The construction and specification of these chip-on-wire LEDs is explained more fully in the co-pending application filed of even date herewith entitled "Anisotropic Etching of Silicon Wafer Materials to Create Micro-Reflector Cavities for LED Die," which has been incorporated by reference herein. Each of the silicon wafers 12 contains four green LED die 14, arranged in a series-parallel arrangement with two die being wired in series. Each of the silicon wafers 12 also contain two red LED die 16 wired in series and two blue LED die 18 wired in series. By varying the relative current applied to each of the four green LED dies 14, two red LED dies 16, and two blue LED dies 18, any color of light may be created by each of the silicon wafers 12. As will be explained in more detail below, the use of an eight-bit controller in the preferred embodiment allows each light module 10 to produce light in over sixteen million different colors.

Each of the wafers 12 are housed in a thermally conductive package 20 that functions as a heat sink or heat spreader for the silicon wafers 12. The heat spreader 20 is in turn laminated to a printed circuit board material 22 that contains gold wire bond pads (not shown) for connection to the silicon wafers 12. Board 22 also contains electronic circuitry to provide control functions to each wash light module 10 as will be described below.

To eliminate dependency of array current on both supply voltage and temperature and forward voltage variations between LED die, the preferred embodiment utilizes a current regulator. Constant current regulation allows the LED dies 14, 16, and 18 to be driven at higher forward currents at the design voltage without exceeding the maximum allowable forward current since the drive current doesn't increase due to over voltage conditions. This general type of circuit is sometimes referred to as a "series-pass" regulator. The circuit uses a dynamic load in series with the load being regulated to achieve this effect.

Figure 2:
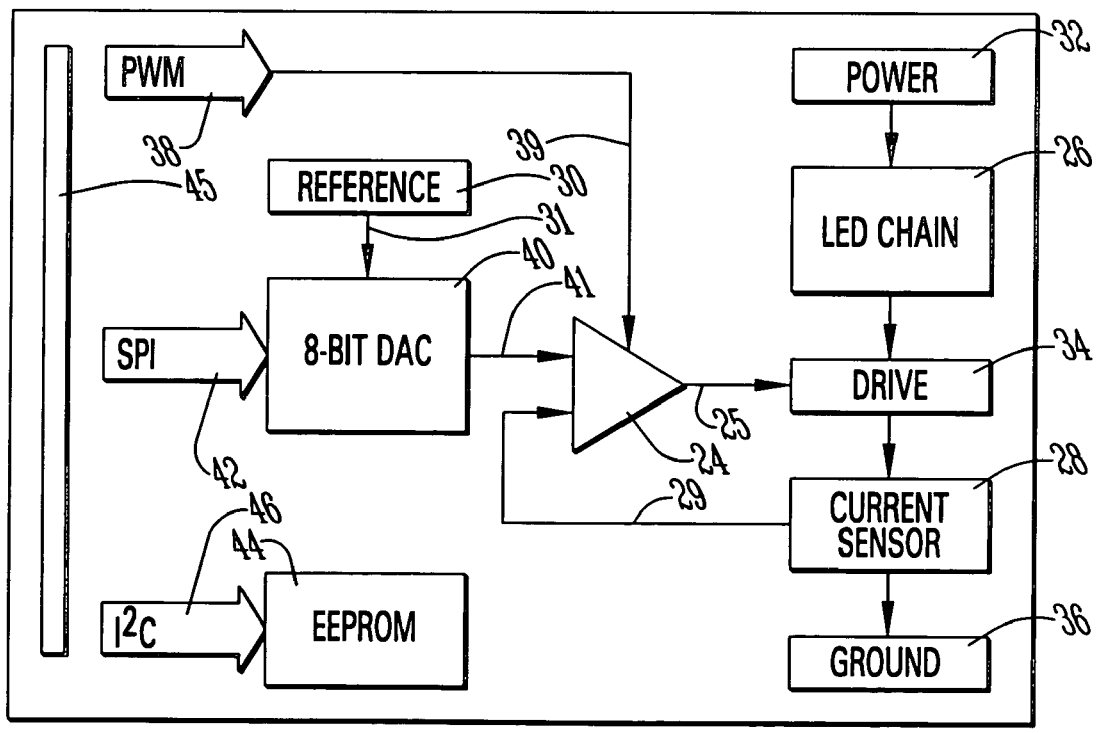
FIG. 2 is a block diagram of the logical elements of a control system for an LED light module according to a preferred embodiment of the present invention.

A preferred embodiment of the current regulator is graphically illustrated in FIG. 2. Power unit 32 provides electrical power to energize LED array 26. Each LED array 26 is composed of one or more of LED dies 14, 16, and 18 as described above. The core component of the current regulator is high-gain amplifier 24, which is connected to drive 34 in a feedback circuit. Amplifier 24 functions to vary the dynamic load of the power circuit that includes LED array 26 by means of its output to drive 34. Amplifier 24 measures the current through the load by measuring the voltage drop across current sensor 28, in series with drive 34, through the current sensor output. The voltage at current sensor 28 is measured against the voltage at system ground 36. Amplifier 24 then compares the voltage at current sensor 28 with an adjusted reference voltage signal from Digital-to-Analog Converter (DAC) unit 40. DAC unit 40 functions to generate an adjusted reference voltage based on the reference voltage from reference voltage source 30, in a manner that will be described below. Amplifier 24 thus generates an amplifier output signal to drive 34 that is appropriate to keep the adjusted reference voltage from DAC unit 40 equal to the voltage drop across current sensor 28. At minimum adjusted reference voltage values, the voltage drop across the dynamic load, as fed through drive 34, goes to a minimum value (drop out voltage). At higher values of the adjusted reference voltage, the voltage drop across the dynamic load increases so as to maintain a fixed current through LED array 26 and the other components of the load. The total current through LED array 26 will thus be independent of supply voltage, temperature and forward voltage variations in the LED Array 26 as long as the current regulator remains in the active region for the particular components selected to implement amplifier 24 and current sensor 28.

Also shown in FIG. 2 is controller 45, which in the preferred embodiment is responsible for generating control signals necessary to operate light module 10. Controller 45 comprises three functional units for generating control signals, namely, Pulse Width Modulation (PWM) communications unit 38, Serial Peripheral Interface (SPI) communications unit 42, and Inter-Integrated Circuit (I$^2$C) communications unit 46. PWM unit 38, SPI unit 42, and I$^2$C unit 46 may be implemented using hardware, firmware, software, or a combination of these elements.

PWM unit 38 provides the "on" and "off" PWM signal fed to amplifier 24 to control LED array 26. Digital-to-Analog Converter (DAC) unit 40 feeds the adjusted reference voltage into amplifier 24, and allows light module 10 to be calibrated in a manner as will be described further below. The PWM signal from PWM unit 38 is active (on) high. Grounding the PWM signals from PWM unit 38 will turn off LED array 26. By rapidly turning amplifier 24 on and off through the use of PWM unit 38, the perceived intensity of the light produced by LED array 26 may be varied. Three PWM signals are needed to drive each LED array 26, one for each color red, green, and blue, corresponding to LED arrays 14, 16, and 18, on each wafer 12 of light module 10.

Figure 3:
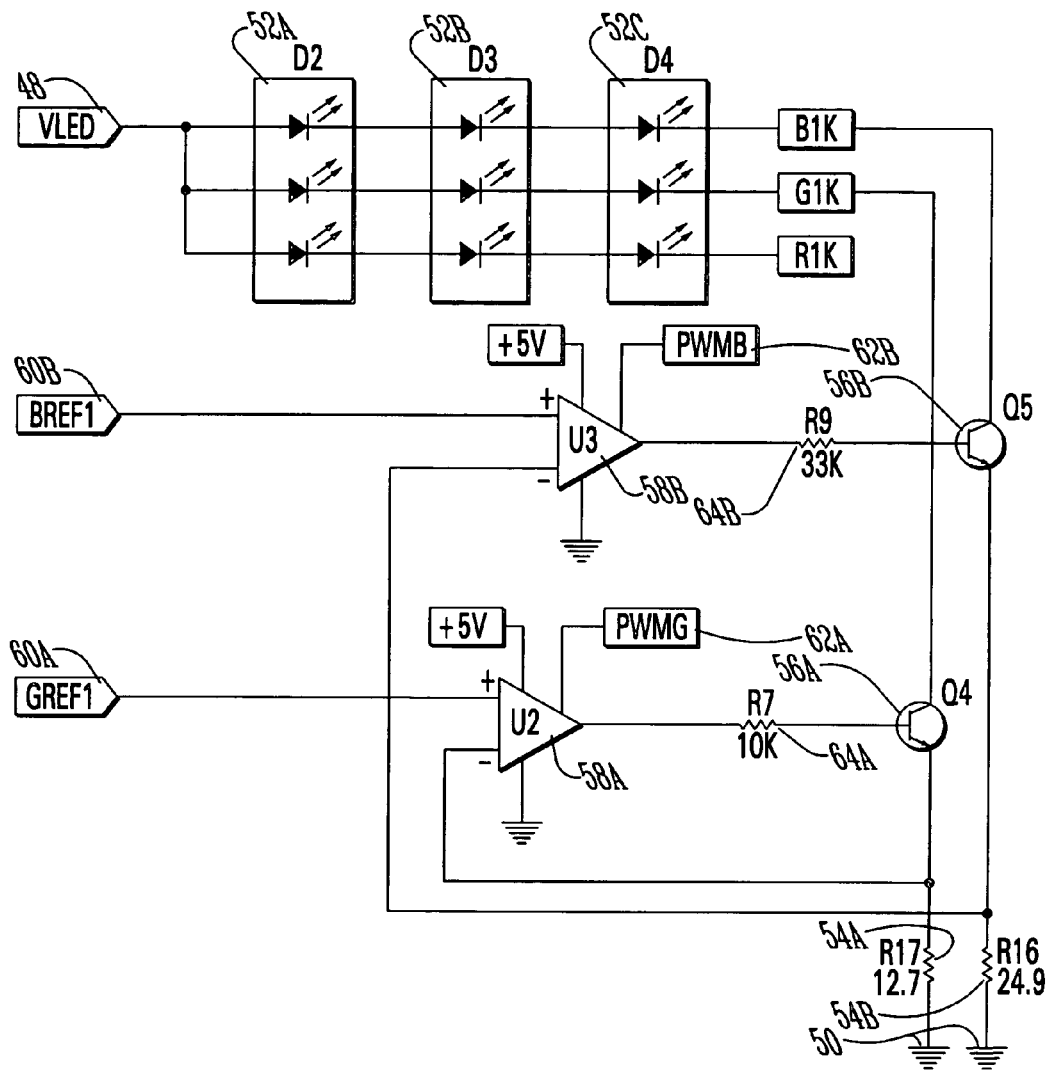
FIG. 3 is a circuit diagram of the current regulation feedback portion of the control system for an LED light module according to a preferred embodiment of the present invention.

Serial Peripheral Interface (SPI) unit 42 allows communication between the system and the microcontroller. SPI is a well-known, industry standard communications protocol. SPI provides synchronous serial interface for control and data transfer between a master and one or more slave units. An SPI interface consists of four ports: serial clock (CLK), chip select (CS), serial input (SI), and serial output (SO). (Note that these inputs are not shown in FIG. 2, but their use in a preferred embodiment of the present invention is shown in FIG. 3 and described below.) The serial clock is the input for the master clock signal, which determines the speed of the data transfer. The chip select (CS) activates the SPI interface; when the CS value is high, the interface will not accept the clock signal or data. Serial input (SI) receives serial information into a shift register on the rising edge of the serial clock, and the serial output (SO) port shifts out data serially on the falling edge of the serial clock signal. SPI unit 42 allows the use of daisy-chaining with slave devices, as in the case of the LED light modules 10 in the present invention.

EEPROM unit 44 provides permanent, non-volatile storage for calibration and system information. This information includes but is not limited to the calibration data for each of the five LED chains, the serial number for the module, the date and location of manufacture, and the date of last calibration. The calibration data in EEPROM unit 44 is used to manipulate the power to each corresponding LED array 26 above or below a baseline level in order to compensate for the variances in the LED array 26 intensity from device to device. EEPROM unit 44 also provides a storage location for the necessary information that allows each LED array 26 to be addressed separately on the lighting system network.

EEPROM unit 44 includes a communications connection provided by an Inter-Integrated Circuit (I$^2$C) unit 46. I$^2$C is a well-known, industry standard serial communications protocol using a two-wire, bi-directional bus. I$^2$C interface 46 is used to write and read information from the EEPROM unit 44 on each module 10. By utilizing I$^2$C unit 46, each corresponding LED array 26 can be tuned according to a standardized light source as described below through the writing of data across I$^2$C unit 46 into EEPROM unit 44. In addition, information can be written across I$^2$C unit 46 into EEPROM unit 44 identifying the date of the last calibration of the corresponding LED light module 10.

One of the design goals in the preferred embodiment was to minimize the number of connections necessary from the LED module 10, which results in a cost reduction in manufacture. Towards this end, no addressing pins were included in the interconnection scheme. Without addressing pins, it became necessary to communicate with each LED module 10 independently, as there was no way of distinguishing them apart on the bus formed by the I$^2$C interface 46. Thus, the microcontroller (not shown) drives four independent I$^2$C interface 46 busses. As the microcontroller does not have integrated hardware capable of performing communications according to the I$^2$C interface 46 protocol, these communications are handled in software executed on the microcontroller.

The main power bus for the preferred embodiment of the invention is a single +28V/GND pair, as shown in FIG. 2 as power unit 32. As most of the circuitry in each of the LED modules 10 and the controller board (not shown) is run at +5V, a power regulator (not shown) must be included on the controller board to generate the +5V. In the preferred embodiment, the power supply on the controller boards is a switching regulator powered by a National Semiconductor LM2674 regulator. This chip is capable of delivering 500 mA of current at +5V. The operation of this circuit is described in greater detail in the LM2674 datasheet and related supporting documentation from National Semiconductor, which is incorporated herein by reference. Other power regulators are available that could be substituted to provide the 500 mA of current at +5V required in the preferred embodiment of the present invention.

Turning now to FIG. 3, a particular circuit implementation for the current regulator according to the preferred embodiment of the invention may be described. Power is provided to the circuit in the form of a twenty-eight volt (+28V) source (not shown) across VLED pin 48 and system ground 50. The LED chain, comprised of LED units 52A, 52B, and 52C, consists of multiple LEDs, arranged such that the overall forward voltage is somewhat lower than the supply voltage. The headroom is needed to allow proper current control. It should be noted that in the actual implementation of the preferred embodiment there are two green LED chains, one blue LED chain, and one red LED chain per LED module 10, but only a portion of these (and a portion of the supporting circuitry and electronics) are shown in FIG. 3 for reasons of clarity.

The current sensor is simply a static resistor, represented by 54A and 54B. In an effort to preserve voltage headroom and reduce power consumption, the resistance is calculated such that a 500 mV drop will occur at the nominal current level through the LED chain formed by each of LED units 52A, 52B, and 52C. For example, if a nominal current of 20 mA was desired through an LED chain, a resistor 54A or 54B of 500 mV/20 mA or 25 ohms would be used. To improve circuit consistency, these resistors preferably should be selected from those of the type that have a 1% or better tolerance. Such resistors are well known in the art. It is also desirable to use resistors with high temperature stability (that is, low drift) to avoid brightness and/or color shift with temperature. Again, such resistors are well known and widely available commercially.

The drive unit of the preferred embodiment for each LED chain formed by LED units 52A, 52B, and 52C is accomplished using a general-purpose NPN transistor, such as the industry-standard 2N4401 integrated circuit produced by a number of manufacturers. This transistor is arranged in a low-side configuration, as illustrated in FIG. 3 as transistors 56A and 56B. Increasing the voltage on the drive will, as a result of the function of these devices, cause an increase in current through the LED chain formed by each of LED units 52A, 52B, and 52C. It should be noted that the current sense resistors 54A and 54B are electrically connected to the emitters of the drive transistors. This has several implications, but two are particularly worthy of note. First is the effect of reducing the gain of transistors 56A and 56B. This is a desirable effect in this application because it serves to limit oscillations in the drive due to high gain, improving the stability of the circuit. Secondly, putting the sense resistors 54A and 54B on the emitter introduces a complication in the current sensing. Since the base current going into the transistor also exits the emitter, the voltage on the emitter resistor is bolstered somewhat by the base current. Since transistors 56A and 56B are operating towards their linear region, the error percentage is relatively constant, and one can simply compensate by adjusting the calibration of the unit slightly higher. Experiments in the development of the preferred embodiment of the present invention have revealed that the base current in this case is somewhat less than 1% of the total current being sensed at sense resistors 54A and 54B.

The operational amplifiers (op-amps) 58A and 58B provide a means of maintaining a specific current flow through the LED chains formed by LED units 52A, 52B, and 52C. They perform this function by monitoring the voltage from the current sense resistors 54A and 54B, respectively, and adjusting their output to the drive transistors 56A and 56B until the voltage from the current sense resistors 54A and 54B matches the reference voltage from DAC unit 40, which is illustrated in FIG. 3 as input at pins 60A and 60B, respectively. Series resistors 64A and 64B are placed between the op-amps 58A and 58B and drive transistors 56A and 56B, respectively, to improve the response of the circuit. Resistors 64A and 64B reduce the base current feeding drive transistors 56A and 56B, and thus limit the current through the LED chain formed by each of LED units 52A, 52B, and 52C. The op-amps 58A and 58B are thus required to use more of their output range to accomplish the drive task, minimizing the effects of noise and transients in the circuit. This arrangement also prevents op-amps 58A and 58B from overreacting, reducing any overshoot current through the LED chain formed by each of LED units 52A, 52B, and 52C.

Brightness control in the preferred embodiment of the invention is accomplished through the use of pulse-width modulation (PWM), with three PWM signals being used, one for each of the three LED colors, red, green, and blue. These PWM signals originate from the controller, implemented in the preferred embodiment of the present invention as a microcontroller on the controller board (not shown in FIG. 3). The microcontroller used in the preferred embodiment is an T89C51 CC01UA-7CTIM manufactured by ATMEL Corporation of San Jose, Calif. The PWM signals from the microcontroller are fed into the shutdown pins 62A and 62B on op-amps 58A and 58B, respectively. The microcontroller has five counters capable of generating PWM output, but only three of these are implemented to generate the PWM signals to drive each of the LED units 52A, 52B, and 52C. The frequency of the microcontroller PWM output has been set such that the PWM signal is occurring at 400 Hz in the preferred embodiment. One of the advantages of choosing this frequency is that the Federal Aviation Administration (FAA) electromagnetic (EM) emission requirements are less stringent at this frequency, since it coincides with the frequency of operation of aircraft generators. The output drive from the microcontroller is fairly weak, so it is necessary to buffer these signals before fanning out to the individual LED modules 10. Such buffering may be accomplished in a manner as is well known in the art. When op-amps 58A and 58B are disabled by a "low" signal through shutdown pins 62A and 62B, their output goes to a high-impedance state, effectively shutting off the corresponding generation of colored light from the LEDs in LED units 52A, 52B, and 52C. Rapid cycling of the PWM signal generates the effect of light of a particular intensity from each of LED units 52A, 52B, and 52C, generating an overall light output from each light module 10 of a desired temperature and intensity.

Figure 4:
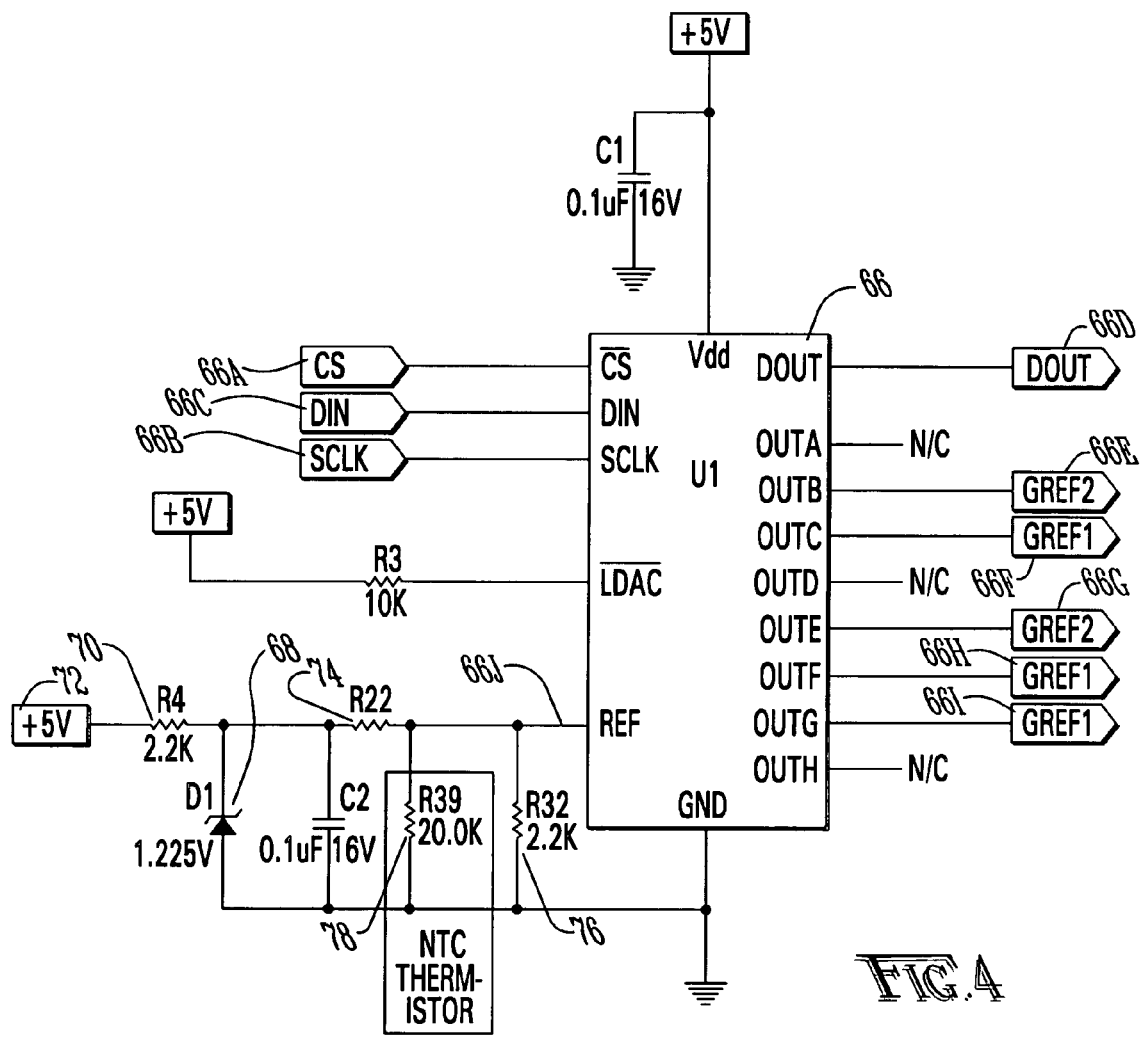
FIG. 4 is a circuit diagram of the digital-to-analog converter portion of the control system for an LED light module according to a preferred embodiment of the present invention.

Turning now to FIG. 4, a particular circuit implementation for the digital-to-analog converter (DAC) unit 40 according to the preferred embodiment of the invention may be described. DAC chip 66 is used to provide a calibration mechanism for the circuit. In the preferred embodiment, DAC chip 66 is the 5258 DAC chip available from Maxim Integrated Products of Sunnyvale, Calif. A number of other such integrated circuits are available to accomplish the same function, and could be substituted in the preferred embodiment of the invention. Transmission of intensity data to DAC chip 66 is accomplished through a pseudo-SPI interface (pins 66a, 66b, 66c, 66d) of DAC chip 66. Pin 66a corresponds to the SPI interface CS input, pin 66b corresponds to the SPI interface CLK input, pin 66c corresponds to the SPI interface SI input, and pin 66d corresponds to the SPI interface SO output. Pins 66a, 66b, and 66c interface with the system microcontroller, which includes the SPI unit 42. The protocol of the SPI messaging is well known in the art, and is described in the Maxim MAX5258/5259 datasheet, which is incorporated herein by reference. The microcontroller uses the SPI interface 42 to communicate with the DAC chip 66 on each of the LED modules 10. The modules 10 are arranged in a daisy-chain configuration to allow a single SPI bus to send data to all modules 10 on a particular controller board matched with a particular microcontroller. The method of daisy-chaining devices using SPI interface 42 is known in the art, and is further explained in the Maxim MAX5258/5259 datasheet. The chip select (CS) and clock (CLK) lines, pins 66a and 66c, respectively, are driven in parallel to all LED modules 10 attached to the controller board. The data lines are daisy-chained from SO (pin 66d) of one module 10 to the SI input (pin 66c) of the next LED module 10. Because of the internal functioning of the eight-bit shift register within DAC chip 66, data being shifted is delayed by 16 clock cycles as it passes through DAC chip 66.

The analog outputs from each DAC chip 66 are supplied to op-amps 58A and 58B as reference voltages, which are then compared to the current sense voltages at sense resistors 54A and 54B as described above. Since there are five LED chains in the preferred embodiment (two of which have been omitted from the drawings for clarity), only five of the eight outputs from DAC chip 66 are used. Pins 66e, 66f, 66g, 66h, and 66i correspond to the B, C, E, F, and G outputs of DAC chip 66, respectively. The five outputs that are selected were chosen based simply on ease of printed circuit board routing, and any five of the eight outputs could be chosen in alternative embodiments as desired.

The reference voltage value for DAC chip 66 is based on the desired sense resistor 54A and 54B voltage. Since in the preferred embodiment the target voltage for current sense resistors 54A and 54B was 500 mV, a reference voltage of 1V was selected to allow DAC chip 66 to adjust the current through the LED chain from 0% to 200% of the nominal value. Adjustment resolution is approximately 0.8% of nominal current level per increment. This reference voltage may be adjusted depending on the desired range of calibration and the desired resolution. It should be noted that in the preferred embodiment some overhead was preserved to allow older, dimmed LED light modules 10 to be recalibrated back to original factory brightness. This is an important consideration given the long life expectancy of light modules 10 due to their solid state design.

Precision voltage reference diode 68 forms the heart of a shunt voltage reference for the preferred embodiment of the invention. Resistor 70 provides a shunt to drop the voltage from the input of five volts (+5V) at input 72 to the diode 68 value of 1.225V. Static resistors 74 and 76 form a resistor ladder to present a voltage of approximately 1V to the REF input (pin 66*j*) of DAC chip 66. Other values of precision reference may be used, provided the resistor ladder values are adjusted to allow a 1V reference signal to DAC chip 66. It should be noted that the precision reference should have good temperature stability (low drift) to avoid brightness shift in the lights with temperature.

Negative Temperature Coefficient (NTC) thermistor 78 is intended to provide some protection against overheating. At nominal temperatures, the higher impedance of thermistor 78 will have little effect on the resistor ladder formed by resistors 74 and 76. At elevated temperatures, however, thermistor 78 will begin to lower the resistance of the lower leg of the ladder, thereby lowering the voltage present at the REF input (pin 66*j*) of DAC chip 66. The DAC chip 66 in turn will lower all of its analog outputs (such outputs used in this application being pins 66*e*, 66*f*, 66*f*, 66*h*, and 66*i*) proportionally, thus lowering the current in each of the LED chains through LEDs 52A, 52B, and 52C, and therefore reducing the power consumption (and heat generated) by the LED light module 10. The impedance value of 20,000 ohms called for in the preferred embodiment of thermistor 78 is an estimation based on an approximately ten to one (10:1) impedance ratio with static resistor 76, which in the preferred embodiment is set at a value of 2,200 ohms.

Having described the various components and interconnections of the controller board and light module 10 of a preferred embodiment of the present invention, the method of providing test and calibration functions with respect to each light module 10 of the preferred embodiment will now be described. In order to compensate for variations in LED light output (as well as component values), all LED modules 10 must be calibrated to obtain a uniform light output across each LED module 10 grouping. For example, in the preferred embodiment, a grouping may be a line or grid of "wash" lights in an aircraft or watercraft cabin, which must be of uniform temperature and intensity in order to avoid light and dark spots, or spots of varying color, across the cabin. It should be noted that it may be desirable at times to produce certain effects with wash lights, but in order to produce a reproducible and precisely predictable effect the light modules 10 must nevertheless be calibrated with respect to each other so that the desired effect is achieved. This calibration is ideally handled during the final testing stages in production and installation of the preferred embodiment of the invention, while periodic calibration may be performed from time to time thereafter. In addition, it is important that each light module 10 produce light that is precisely calibrated to a reference standard, so that targets for light color and temperature may be met without adjustment and testing each time a change in light color and temperature is desired.

In order to perform this calibration, a dedicated tool for testing and calibrating the LED modules 10 is required in the preferred embodiment of the invention. The calibration tool connects to a standard personal computer (PC) running software to control the testing apparatus and log performance data. Software running on the PC will perform light output measurements from each module 10 via the light intensity sensor on the calibration tool; such sensors are known in the art and are commercially available.

The first task the testing apparatus and software will attempt to perform is to establish communication with the LED module 10 of interest. Established communication is based on current measurements, as well as data being written to and read from EEPROM unit 44. Abnormally high (or low) current, or a failure to read back values written to EEPROM unit 44, would indicate either a misinserted or a failed LED module 10. Once communication has been established, the testing software on the PC will write manufacturing data and a serial number to EEPROM unit 44 on the LED module 10. This information will also be logged on the PC by the testing software.

Once the testing software on the PC has verified communication with the LED module 10 and written the manufacturing info and serial number to EEPROM unit 44, it will attempt to calibrate the light output of module 10 to predetermined levels. It will do this by setting DAC unit 66 calibration and then reading the light output measured at the light sensor of the calibration tool. DAC unit 66 calibration will be adjusted according to the readings obtained from the light sensor of the calibration tool, and the test repeated. Once the software on the PC obtains a light reading that is within the prescribed output range, it will certify the module 10 and the operator will remove it from the test fixture. Performance data is also logged during the process.

The present invention has been described with reference to certain preferred and alternative embodiments that are intended to be exemplary only and not limiting to the full scope of the present invention as set forth in the appended claims.

What is claimed is:

1. A lighting system, comprising:
   (a) an LED;
   (b) a current regulator circuit (i) in communication with said LED and (ii) comprising: (A) a drive unit in series with said LED; (B) a current sensor in communication with said drive unit and said LED; (C) an adjusted voltage source with an output; and (D) a comparison unit in communication with said drive unit, said current sensor, and said adjusted voltage source wherein said comparison unit is operable to generate an output to said drive unit that generates a voltage across said current sensor approximately equal to that of said output of said adjusted voltage source;
   (c) a calibration circuit in communication with said current regulator; and
   (d) a controller in communication with said comparison unit, wherein said controller is operable to generate a signal to activate or deactivate said comparison unit.

2. The lighting system of claim 1, further comprising a plurality of LED arrays operable together to generate light of a spectrum of colors.

3. The lighting system of claim 1, wherein said comparison unit is an operational amplifier.

4. The lighting system of claim 1, further comprising a reference voltage source, and wherein said adjusted voltage source receives said reference voltage source as an input.

5. The lighting system of claim 4, wherein said controller is operable to send a signal to said adjusted voltage source to modify said output of said adjusted voltage source.

6. The lighting system of claim 4, wherein said adjusted voltage source is a digital-to-analog converter.

7. The lighting system of claim 5, further comprising a storage unit in communication with said controller, wherein said storage unit comprises calibration data and said controller is operable to receive said calibration data from said storage unit and send said calibration data to said adjusted voltage source to modify said output of said adjusted voltage source.

8. The lighting system of claim 7, wherein said storage unit is an EEPROM.

9. A lighting system, comprising:
   (a) a plurality of LED arrays, wherein each of said LED arrays is operable to generate light of a distinct color, at least two of said LED arrays are operable to generate light of two distinct colors, and wherein said plurality of LED arrays are operable together to generate light of a spectrum of colors;
   (b) a calibration circuit in communication with each of said LED arrays, wherein said calibration circuit (i) is operable to regulate a current applied to each of said LED arrays in order to produce light from each of said LED arrays of a standard temperature and intensity and (ii) comprises: (A) a drive unit in series with each of said LED arrays; (B) a current sensor in communication with each said drive unit and each said LED array; (C) an adjusted voltage source with an output; and (D) a comparison unit in communication with each said drive unit, said current sensor, and said adjusted voltage source wherein said comparison unit is operable to generate an output to each said drive unit that generates a voltage across said corresponding current sensor approximately equal to that of said output of said corresponding adjusted voltage source; and
   (c) a controller in communication with said calibration circuit and operable to generate a signal to activate or deactivate said comparison unit.

10. The lighting system of claim 9, further comprising a reference voltage source, and wherein said adjusted voltage source receives said reference voltage source as an input.

11. The lighting system of claim 10, wherein said adjusted voltage source is a digital-to-analog converter.

12. The lighting system of claim 9, wherein said comparison unit is an operational amplifier.

13. The lighting system of claim 10, wherein said controller is in communication with said adjusted voltage source, and wherein said controller is operable to send a signal to said adjusted voltage source to modify said output of said adjusted voltage source.

14. The lighting system of claim 13, further comprising a storage unit in communication with said controller, wherein said storage unit comprises calibration data and said controller is operable to receive said calibration data from said storage unit and send said calibration data to said adjusted voltage source to modify said output of said adjusted voltage source.

15. The lighting system of claim 14, wherein said storage unit is an EEPROM.

16. A method of testing a light module in a lighting system, said method comprising the steps of:
   (a) measuring a value for a light output from the light module with a light sensor;
   (b) transmitting the light output value from the light sensor to a processor;
   (c) transmitting a signal from the processor to the light module to adjust a calibration value of the light module in response to the light output value, in order to adjust the light output value into a prescribed range;
   (d) measuring a value for a light output from the light module with the light sensor;
   (e) transmitting the light output value from the light sensor to a processor; and
   (f) comparing the light output value to the prescribed range to confirm that the light output value from the light module is within the prescribed range.

17. The method of claim 16, further comprising the step of adapting a test fixture to receive the light module and pass communications between the processor and the light module.

18. The method of claim 17, further comprising the step of transmitting at least one of a serial number and manufacturing data from the processor to the light module.

19. A method of controlling a lighting system, wherein said method comprises the steps of:
   (a) applying current to an LED;
   (b) measuring the voltage across a current sensor in series with the LED;
   (c) comparing the voltage across the current sensor with an adjusted reference voltage;
   (d) emitting an electrical signal to a drive unit in series with the LED and the current sensor to cause the voltage across the current sensor to approximately equal the adjusted reference voltage; and
   (e) emitting a signal from a controller to turn on and off the electrical signal to the drive unit.

20. The method of claim 19, further comprising the step of operating a plurality of LED arrays together to generate light of a spectrum of colors.

21. The method of claim 19, further comprising the step of generating the adjusted reference voltage by modifying a reference voltage based on a calibration value.

22. The method of claim 21, wherein said step of generating the adjusted reference voltage is performed by a digital-to-analog converter, and further comprising the steps of:
   (a) emitting a digital signal from the controller to the converter, wherein the digital signal comprises an adjustment value; and
   (b) transforming the digital signal comprising the adjustment value into an adjusted reference voltage by modifying the reference voltage by the adjustment value.

23. The method of claim 22, further comprising the steps of:
   (a) storing the adjustment value in a storage unit; and
   (b) reading said adjustment value from said storage unit to said controller.

* * * * *

UNITED STATES PATENT AND TRADEMARK OFFICE
CERTIFICATE OF CORRECTION

| | | |
|---|---|---|
| PATENT NO. | : 7,615,939 B2 | Page 1 of 1 |
| APPLICATION NO. | : 10/802277 | |
| DATED | : November 10, 2009 | |
| INVENTOR(S) | : Halter | |

It is certified that error appears in the above-identified patent and that said Letters Patent is hereby corrected as shown below:

On the Title page,

[*] Notice: Subject to any disclaimer, the term of this patent is extended or adjusted under 35 USC 154(b) by 1249 days Delete the phrase "by 1249 days" and insert -- by 1592 days --

Signed and Sealed this

Fifteenth Day of June, 2010

David J. Kappos
*Director of the United States Patent and Trademark Office*